US011953576B2

(12) United States Patent
Klumper et al.

(10) Patent No.: US 11,953,576 B2
(45) Date of Patent: Apr. 9, 2024

(54) SMART CURRENT TRANSFORMER SYSTEM

(71) Applicant: GENERAC POWER SYSTEMS, INC., Waukesha, WI (US)

(72) Inventors: Kyle Klumper, Vancouver (CA); Jonathan Hallam, Vancouver (CA); Shabnam Shambayati, Vancouver (CA); Jonathan Li, Vancouver (CA); Colby Gore, Vancouver (CA); Ching Kun Meng, Vancouver (CA)

(73) Assignee: Generac Power Systems, Inc., Waukesha, WI (US)

( * ) Notice: Subject to any disclaimer, the term of this patent is extended or adjusted under 35 U.S.C. 154(b) by 463 days.

(21) Appl. No.: 17/280,088

(22) PCT Filed: Apr. 8, 2019

(86) PCT No.: PCT/US2019/026286
§ 371 (c)(1),
(2) Date: Mar. 25, 2021

(87) PCT Pub. No.: WO2020/068160
PCT Pub. Date: Apr. 2, 2020

(65) Prior Publication Data
US 2022/0003828 A1 Jan. 6, 2022

Related U.S. Application Data

(60) Provisional application No. 62/735,917, filed on Sep. 25, 2018.

(51) Int. Cl.
*G01R 35/02* (2006.01)
*H01F 27/40* (2006.01)
*H01F 27/42* (2006.01)

(52) U.S. Cl.
CPC .......... *G01R 35/02* (2013.01); *H01F 27/402* (2013.01); *H01F 27/427* (2013.01)

(58) Field of Classification Search
CPC ...... G01R 35/02; H01F 27/402; H01F 27/427
See application file for complete search history.

(56) References Cited

U.S. PATENT DOCUMENTS 9,146,259 B2 * 9/2015 Blake .................. G01R 15/186
9,466,417 B2 * 10/2016 Jefferies ............... G01R 15/183
(Continued)

OTHER PUBLICATIONS

Extended European Search Report for Application No. 19864463.5 dated May 31, 2022.
(Continued)

*Primary Examiner* — Adolf D Berhane
(74) *Attorney, Agent, or Firm* — Merchant & Gould P.C.

(57) ABSTRACT

A smart current transformer for determining primary current or power consumption, by stepping down the primary current to a secondary current for subsequent measurement by a connected meter. The current transformer is provided with a connected non-volatile memory for storing calibration data (and optionally identification data) regarding that particular current transformer. The calibration data can include the gain error and/or phase delay for the current transformer, as determined from prior calibration testing of the current transformer. The calibration data may be communicated to or otherwise determined by the meter, and used to calibrate the measurement of the secondary current, in order to determine the primary current or power consumption. Also disclosed is a system and method utilizing such a smart current transformer.

21 Claims, 11 Drawing Sheets

(56) References Cited

U.S. PATENT DOCUMENTS

| | | |
|---|---|---|
| 2012/0062249 A1 | 3/2012 | Shamir |
| 2012/0101760 A1 | 4/2012 | Sutrave et al. |
| 2012/0268106 A1 | 10/2012 | Blake, Jr. et al. |
| 2016/0124024 A1 | 5/2016 | Jefferies et al. |

OTHER PUBLICATIONS

International Search Report and Written Opinion for International Application No. PCT/US19/26286 dated Jul. 10, 2019 (12 pages).

* cited by examiner

FIG. 12

EEPROM Memory Map (128 Bytes)
☐ (each block represents 1 byte)

| Page | | | | | | | | | | | | | | | | |
|---|---|---|---|---|---|---|---|---|---|---|---|---|---|---|---|---|
| 0 | 8 Bit CRC | Protocol Version | CT Model | Serial Number~50 | | | | Timestamp~52 | | | | | | | | |
| 8 | Timestamp | | | | Turns Ratio | | Calibration Type | | Reserved Header Bytes | | | | | | | |
| 16 | 16 Bit CRC | | I1 | | | | | | I1 Gain Error | | | | | | | |
| 24 | I1 Gain Error | | I1 Phase Delay | | | | | | I2 | | | | | | | |
| 32 | I2 | | I2 Gain Error | | | | | | I2 Phase Delay | | | | | | | |
| 40 | I2 Phase Delay | | I3 | | | | | | I3 Gain Error | | | | | | | |
| 48 | I3 Gain Error | | I3 Phase Delay | | | | | | I4 | | | | | | | |
| 56 | I4 | | I4 Gain Error | | | | | | I4 Phase Delay | | | | | | | |
| 64 | I4 Phase Delay | | Ix ... | | | | | | | | | | | | | |
| 72 | | | | | | | | | | | | | | | | |
| 80 | | | | | | | | | | | | | | | | |
| 88 | | | | | | | | | | | | | | | | |
| 96 | | | | | | | | | | | | | | | | |
| 104 | | | | | | | | | | | | | | | | |
| 112 | | | | | | | | | | | | | | | | |
| 120 | | | | | | | | | | | | | | | | |

SMART CURRENT TRANSFORMER SYSTEM

CROSS-REFERENCE TO RELATED APPLICATIONS

This application is a National Stage Application of PCT/US2019/026286, filed 8 Apr. 2019, which claims benefit of U.S. Application Ser. No. 62/735,917, filed 25 Sep. 2018 and which applications are incorporated herein by reference. To the extent appropriate, a claim of priority is made to each of the above-disclosed applications.

FIELD OF THE INVENTION

The present invention relates to the field of electrical current and energy measurement and management systems. More particularly, the present invention relates to a smart current transformer system.

BACKGROUND OF THE INVENTION

Current transformers (sometimes referred to as "CT"s) are electrical instruments that are commonly used in measuring alternating current. They are conventionally used to "step down" a primary current (usually a high voltage current) to a smaller (typically standardized) current. This stepped-down current will be easier, safer or more suitable than the primary current, for other electrical measurement/management instruments (such as meters) to handle. A current transformer may also be used to isolate measurement or protection circuits from the high voltage of the primary system. The current transformer provides a secondary current that is accurately proportional to the primary current. Further, the current transformer usually presents a negligible load to the primary circuit.

Current transformers are commonly used at industrial and commercial power distribution facilities, such as generating stations and electrical substations, for purposes of measuring and monitoring current at such power systems. CTs are also increasingly being used in residential facilities, such as in "smart" home monitoring applications and energy management applications.

When measuring a primary current, an ideal current transformer will output a secondary current ($I_s$) that is equal to the primary current ($I_p$) multiplied by the turns ratio (n). The turns ratio (n) is equal to the number of turns in the primary winding ($n_p$) over the number of turns in the secondary winding ($n_s$). This relationship is given in the equation:

$$I_s = I_p \times n, \text{ (where } n = n_p/n_s\text{)}$$

Using this relationship, one can indirectly measure a primary current, by measuring the stepped-down secondary current using a suitable meter. An ideal current transformer should not introduce any gain error or phase delay between the primary and secondary currents. However, in practice, there are a multitude of factors which will cause these current values to differ from their ideal cases. By way of example, the factors might include any of the following: phase change or phase delay; burden class/saturation class; rating factor; load; external electromagnetic fields; temperature; physical configuration; capacitive coupling between primary and secondary; resistance of primary and secondary; and core magnetizing current. In metering applications, the above-described errors can produce results which do not meet required specifications.

One approach to tackle this problem is to calibrate any meters to a "Golden CT" with a known gain error and phase delay, and then account for these errors in the application. This would be a reasonably good solution if the errors are constant; however, most current transformers exhibit gain errors and phase delays that are functions of the primary current (as illustrated and discussed later). The consequence of this is that the meters will generally provide accurate measurements only over a small sample range. In addition, there are variations in manufacturing that result in a distribution of performance; one can calibrate to the mean of distribution, but the specified accuracy can only ever be as good as the width of that distribution. It would be advantageous to be able to provide for a current transformer which can allow for even better calibration (where ideal calibration values are provided that are specific for a particular CT).

SUMMARY OF THE INVENTION

The present invention is generally illustrated and described herein in the context of CTs for use in residential applications, such as for measuring and monitoring electricity use and demand at residential homes. It is contemplated that the present invention may be particularly well suited to application in a residential context (e.g. due to its relative ease of use and low cost). However, it should be understood that the present invention is not limited to use in a residential context, but may be employed/adapted for commercial and industrial applications.

Disclosed herein is a smart current transformer (sometimes referred to herein as a "Smart CT"), and a method and system utilizing such a smart current transformer. The Smart CT is a current transformer that is provided with a microchip, an Electrically Erasable Programmable Read-Only Memory ("EEPROM") integrated circuit ("IC") or such other similar data storage device or non-volatile memory. For ease of reference, such data storage device is generally referred to herein as an EEPROM, but it should be understood that this term in intended to encompass microchips, ICs, data storage devices and non-volatile memory. The EEPROM is in wired connection with the Smart CT, and may be either housed therewithin or external thereto. The EEPROM may be used to store certain data regarding that particular current transformer, such as the gain error and/or phase delay for that particular CT (as may have been determined/measured from prior testing of the CT). The data may also be used to identify the particular type of the CT, or such other specifications thereof. This data may be communicated to or otherwise determined by any connected or "downstream" instruments such as meters. Such data can be used by the meters to calibrate the measurements taken, in order to make suitable adjustments in accordance with the known gain errors and/or phase delays of such Smart CT. This may result in greater accuracy in measurements of a primary current. The identification data may also be used to identify the type and/or specification of the Smart CT to the downstream meters/instruments, e.g. to ensure that the appropriate type of CT is being used in such metering applications. In some embodiments, the Smart CT may be connected to an interface, which may be used to facilitate connection between Smart CT and the downstream meter. In some of such embodiments, the EEPROM may be housed within the interface instead of within the Smart CT.

In accordance with an aspect of the present invention, also disclosed herein is a system and method utilising such a Smart CT to facilitate calibration of meters, as may be used to measure and monitor current or power consumption at a primary wire, in order to achieve greater accuracy of such measurements. In one aspect, disclosed herein is a system for measuring current or power consumption at a primary wire, comprising a Smart CT as disclosed above for stepping down a primary current at the primary wire into a secondary current at a secondary wire, the Smart CT provided with a non-volatile memory storing calibration data respecting the Smart CT, a meter in communication (wired or wirelessly) with the Smart CT, wherein the meter is used to measure the current or power consumption at the secondary wire and may be calibrated by taking into account the calibration data in order to determine the current or power consumption, as the case may be, at the primary wire.

BRIEF DESCRIPTION OF THE DRAWINGS

FIG. 12 is a table, illustrating the memory map for an EEPROM chip, as may be used in an embodiment of the Smart CT.

DETAILED DESCRIPTION OF THE INVENTION

Figure 1:
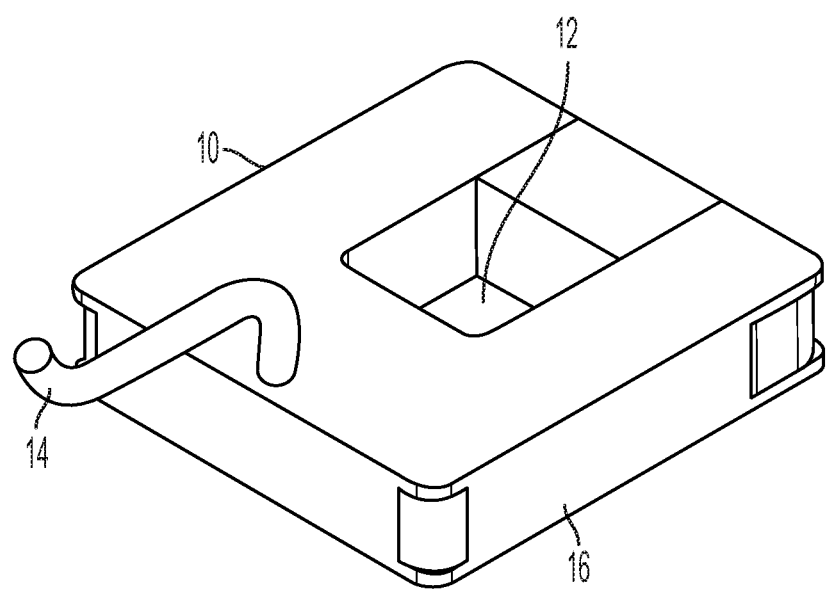
FIG. 1 is an exemplary representation of a current transformer.

A detailed description of one or more embodiments of the present invention is provided below along with accompanying figures that illustrate the principles of the invention. As such, this detailed description illustrates the present invention by way of example and not by way of limitation. The description will clearly enable one skilled in the art to make and use the invention, and describes several embodiments, adaptations, variations and alternatives and uses of the invention, including what is presently believed to be the best mode and preferred embodiment for carrying out the invention. It is to be understood that routine variations and adaptations can be made to the invention as described, and such variations and adaptations squarely fall within the spirit and scope of the invention. For the purpose of clarity, technical material that is known in the technical fields related to the invention has not been described in detail so that the invention is not unnecessarily obscured.

The term "computer" can refer to any apparatus that is capable of accepting a structured input, processing the structured input according to prescribed rules, and producing results of the processing as output. Examples of a computer include: a computer; a general purpose computer; a desktop computer, a network computer, a laptop computer; a computer on a smartphone or other portable device, a supercomputer; a mainframe; a super mini-computer; a mini-computer; a workstation; a micro-computer; a server; an interactive television; a hybrid combination of a computer and an interactive television; and application-specific hardware to emulate a computer and/or software. A computer can have a single processor or multiple processors, which can operate in parallel and/or not in parallel. A computer also refers to two or more computers connected together via a network for transmitting or receiving information between the computers. An example of such a computer includes a distributed computer system for processing information via computers linked by a network. The techniques described herein may be implemented by one or more special-purpose computers, which may be hard-wired to perform the techniques, or which may include digital electronic devices such as one or more application-specific integrated circuits (ASICs) or field programmable gate arrays (FPGAs) that are persistently programmed to perform the techniques, or which may include one or more general purpose hardware processors programmed to perform the techniques pursuant to program instructions in firmware, memory, other storage, or a combination. Such special-purpose computers may also combine custom hard-wired logic, ASICs, or FPGAs with custom programming to accomplish the techniques.

The term a "computer system" may refer to a system having a computer, where the computer comprises a computer-readable medium embodying software to operate the computer.

The term "computer-readable medium" may refer to any storage device used for storing data accessible by a computer, as well as any other means for providing access to data by a computer. Examples of a storage-device-type computer-readable medium include: a magnetic hard disk; a solid state drive; a floppy disk; an optical disk, such as a CD-ROM and a DVD; a magnetic tape; or a memory chip.

The term "software" can refer to prescribed rules to operate a computer. Examples of software include: software; code segments; instructions; computer programs; and programmed logic.

The present invention is directed to a smart current transformer, and a method and system utilizing such a smart current transformer.

As described above, CTs are commonly used to "indirectly" measure an electrical current flowing through a wire (which is referred to as the primary current). Typically, it is not possible or it may be undesirable to measure the primary current directly (e.g. by connecting a multi-meter or ammeter, in series). This may be, for example, because the primary current is of a relatively large magnitude and/or because one does not wish to disrupt/interfere with the current flow. The CT is used to step-down the primary current to a smaller (typically standardized) secondary current. This stepped-down secondary current will be easier, safer or more suitable for electrical measurement/management instruments (such as meters) to handle. By relying on the well understood relationship between the primary current, the secondary current and the turns ratio for a current transformer, one is able to directly measure the secondary current using a suitable meter, and extrapolate that reading to determine the primary current. Information regarding the primary current (e.g. when combined with other electrical measurements) may be useful for determining energy use, power consumption and the like. Further, besides the current, other electrical measurements (such as power consumption) may also be measured in this fashion. The measurement made could be either on the demand/consumption side or on the supply side (e.g. where a facility is generating and supplying electricity of its own, such as through solar panels).

When measuring a primary current, an ideal current transformer will output a secondary current ($I_s$) that is equal to the primary current ($I_p$) multiplied by the turns ratio (n). The turns ratio (n) is equal to the number of turns in the primary winding ($n_p$) over the number of turns in the secondary winding ($n_s$). This relationship is given in the equation:

$$I_s = I_p \times n, \text{ (where } n = n_p/n_s\text{)}$$

(This relationship is also sometimes expressed in terms of the current turns ratio (CTR), i.e.: $I_s = I_p/\text{CTR}$, where CTR=$n_s/n_p$ or CTR=1/n). Using this relationship, one can indirectly determine a primary current, by measuring the stepped-down secondary current using a suitable meter.

Referring to FIG. 1, this shows an exemplary representation of a conventional current transformer 10. To measure the current (primary current) passing through a wire, the current transformer 10 is attached to the wire so that the wire passes through the orifice 12 of the current transformer. Typically, the current transformer 10 has a set of windings (not shown) wound around a hollow core, which is a closed loop. The windings in the CT operate to step-down the primary current to a smaller, secondary current, according to the turns ratio of the CT 10. The secondary current, having been stepped down, can be directed to a meter (not shown in FIG. 1) via outlet 14. The meter can measure and monitor the secondary current, and from that information, we can determine (and monitor) the primary current.

An ideal current transformer should not introduce phase delay between the primary and secondary currents. However, in practice, there are a multitude of factors which will cause these current values to differ from their ideal cases. By way of example, the factors might include any of the following: phase change or phase delay; burden class/saturation class; rating factor; load; external electromagnetic fields; temperature; physical configuration; capacitive coupling between primary and secondary; resistance of primary and secondary; and core magnetizing current. In metering applications, the above-described errors can produce results which do not meet required specifications (i.e. are "out of spec.").

Figure 2:
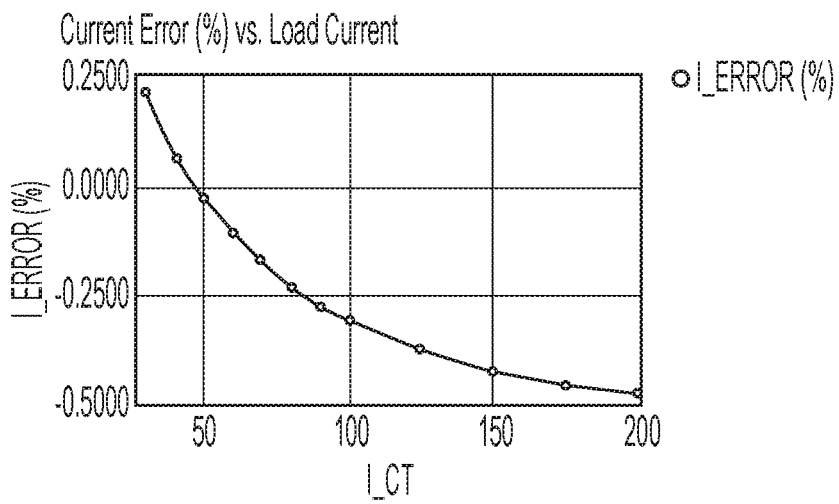
FIG. 2 is a line graph providing an example of the typical relationship between the percentage error of a measured current and an applied load current (in amps) for a particular current transformer.
Figure 3:
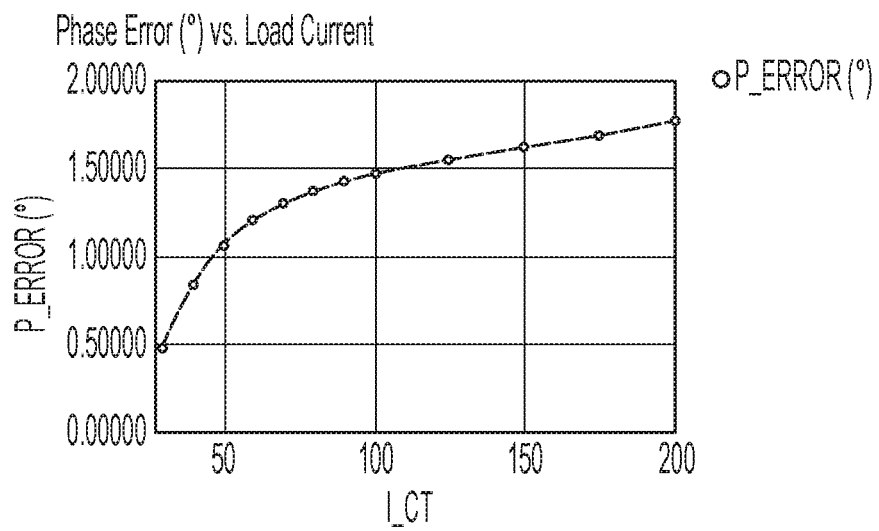
FIG. 3 is a line graph providing an example of the typical relationship between the phase error of a measured current and an applied load current (in amps) for a particular current transformer.

One approach to try to tackle this problem and the associated errors respecting gain errors and phase delays, has been to calibrate any meters to a "Golden CT" with a known gain error and phase delay, and then account for these errors in the application. This would be a reasonably good solution if the errors are constant; however, most current transformers exhibit gain errors and phase delays that are functions of the primary current. Referring to FIG. 2, this is a line graph providing an example of the typical relationship between the percentage error of a measured current and an applied load current (in amps) for a particular current transformer. As can be seen, for any typical CT, the percentage current error varies considerably depending on what the load current is. For instance, in the shown example, a CT may have a percentage error of 0.25% when the load current is around 25 amps, and a percentage error of −0.45% when the load current is 200 amps. Similarly, the phase delay or percentage phase error (given in degrees or °) also varies considerably depending on the load current. FIG. 3 is a line graph providing an example of the typical relationship between the percentage phase error of a measured current and an applied load current (in amps) for a particular current transformer.

The consequence of these gain errors and phase delays is that the meters used to measure the secondary current will generally provide accurate determinations of the primary current only over a small sample range. Another problem is that CTs with larger errors than the known "golden CT" cannot be used for the application.

Figure 4:
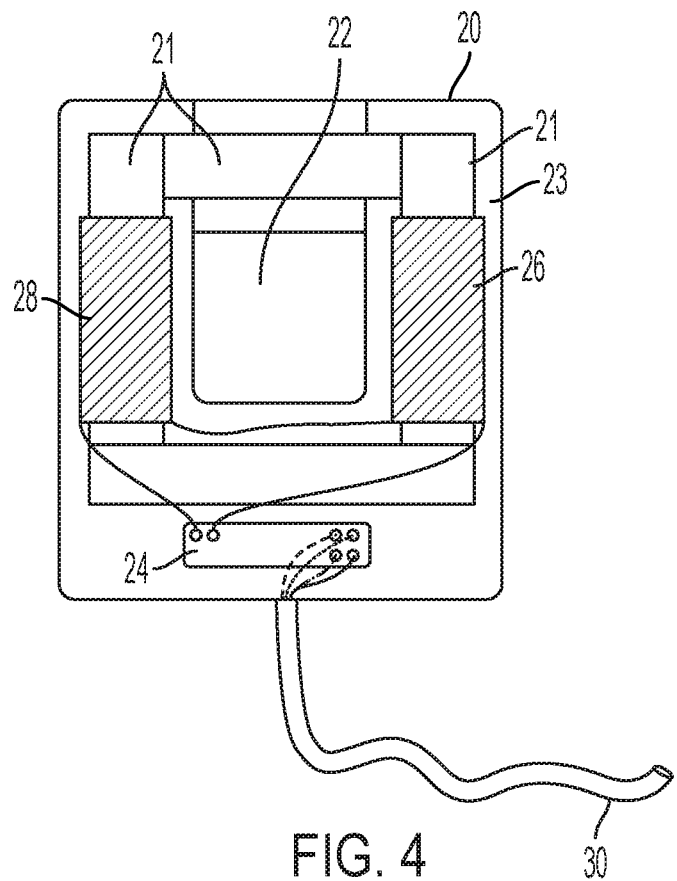
FIG. 4 is a simplified diagram of a Smart CT in accordance with one aspect of the present invention.

FIG. 4 is a simplified diagram of a Smart CT in accordance with one aspect of the present invention. The Smart CT 20 is formed of a closed loop core 21, which defines an orifice 22. A set of windings 26, 28 is wound around the core 21, and these components are housed within a housing 23. In this case, the core 21 constitutes the primary winding (i.e. a single turn coil ($n_p$=1)) of the current transformer; the set of windings 26, 28 constitutes the secondary winding ($n_s$) of the current transformer. The secondary winding is connected to a printed circuit board ("PCB") 24. As shown, the PCB 24 is provided with four output pins, which in turn may be connected to an interface 40 (not shown in FIG. 4) via outlet wire 30.

Figure 5:
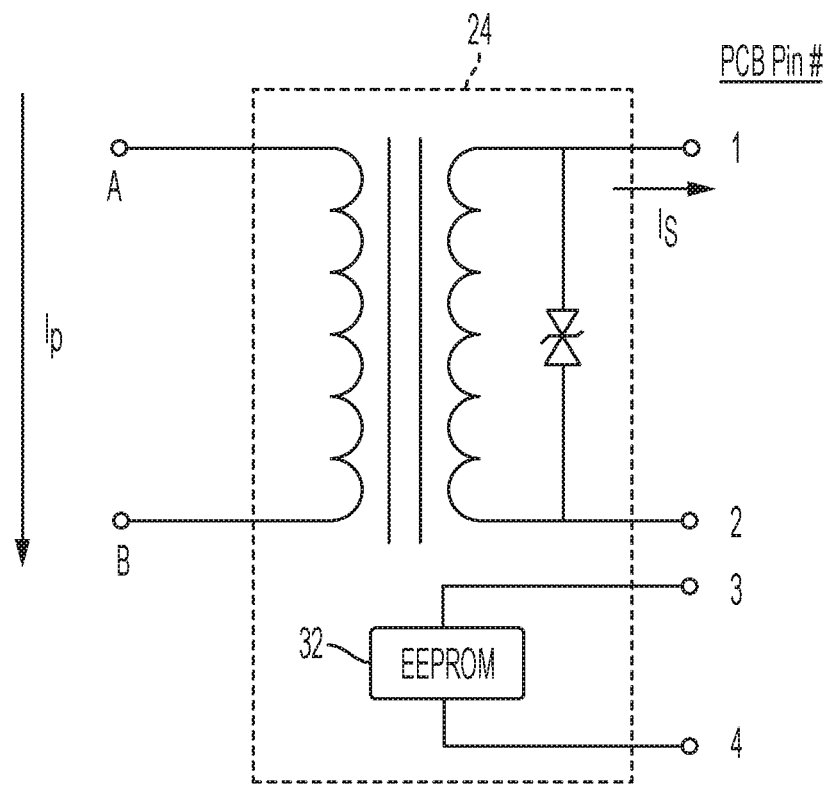
FIG. 5 is a schematic illustrating a Smart CT in accordance with one aspect of the present invention.
Figure 6:
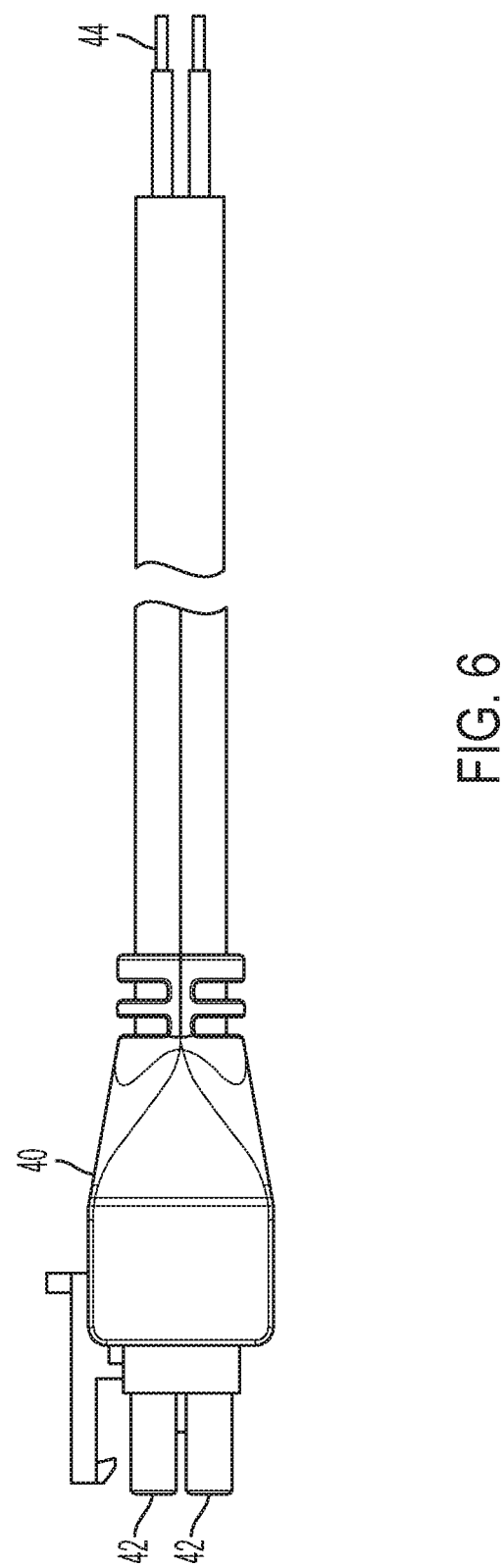
FIG. 6 is an illustration of an interface for use with the Smart CT.
Figure 7:
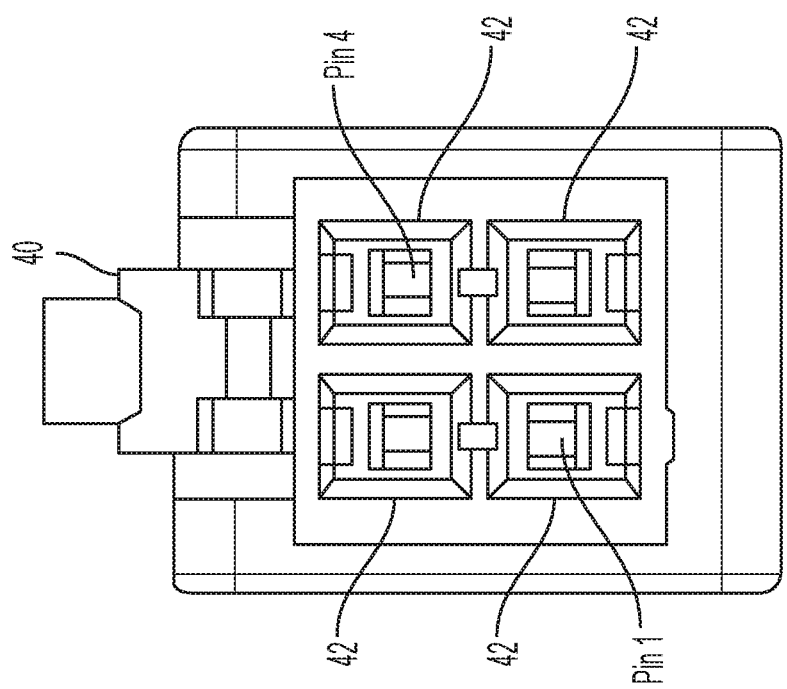
FIG. 7 is an end view of the interface as shown in FIG. 6.

FIG. 5 is a schematic illustrating a Smart CT in accordance with one aspect of the present invention. The PCB 24 is shown in schematic form, as having inputs A and B which are connected to the secondary winding 26, 28 of the Smart CT 20. The outlets at Pin #1 and Pin #2 carry the stepped-down secondary current ($I_s$). Embedded within the PCB 24, is a microchip or EEPROM IC 32, which is connected to the outlets at Pin #3 and Pin #4. Each of the outlets, Pins #1-4, may be connected via the respective pins 44 to an interface 40, which is used to facilitate connection with a downstream meter. An example of such an interface 40 is shown in FIGS. 6 and 7. A suitable meter (not shown) can in turn be connected to the interface 40 via outlets 42, in order to measure (and monitor) the stepped-down secondary current. FIG. 6 shows a side view of an exemplary interface 40 for use with the Smart CT. FIG. 7 is an end view of the same interface shown in FIG. 6.

The EEPROM 32 may be used to store certain data regarding that particular current transformer 20, for use by the downstream meter or such other instruments. The information stored may include the gain error and/or phase delay for that particular Smart CT (as may have been determined/measured from prior calibration testing of the Smart CT). The data may also be used to identify the particular type of the Smart CT, or such other specifications. This data may be communicated to or otherwise determined by any downstream instruments. The nature of such downstream instrument(s) will depend on the particular application involved, but these are typically meters of some sort (including analogue meters, digital meters and "smart" meters), and they are generally referred to herein as "meters". In certain applications, the meters may be configured to interface with a computer or other such device (e.g. via RS-485 or Universal Asynchronous Receiver-Transmitter ("UART") standards). The meters can also be configured to interface with backend platforms, through the use of communication protocols such as Wifi or Zigbee.

In one embodiment, as illustrated herein, the communication with the EEPROM 32 is handled through the one-wire protocol. This protocol is widely documented and well-known in the industry, and would be well understood by one of skill in the art. It is also contemplated, however, that in another embodiment, the communication of the calibration data may be done wirelessly (e.g. using the Bluetooth™ standard). In other embodiments, a system incorporating the Smart CT may wirelessly transmit not only the calibration data, but the measured current data as well (instead of via wired means). Such data concerning the particular CT stored on the EEPROM can be used by the meters to calibrate the current measurements taken, in order to make suitable adjustments in accordance with the known gain errors and/or phase delays of such Smart CT. This may result in greater accuracy in measurements of a primary current (since the data is specific to the particular Smart CT). The identification data may also be used to ensure that the appropriate type of current transformer is being used in such metering application.

Figure 8:
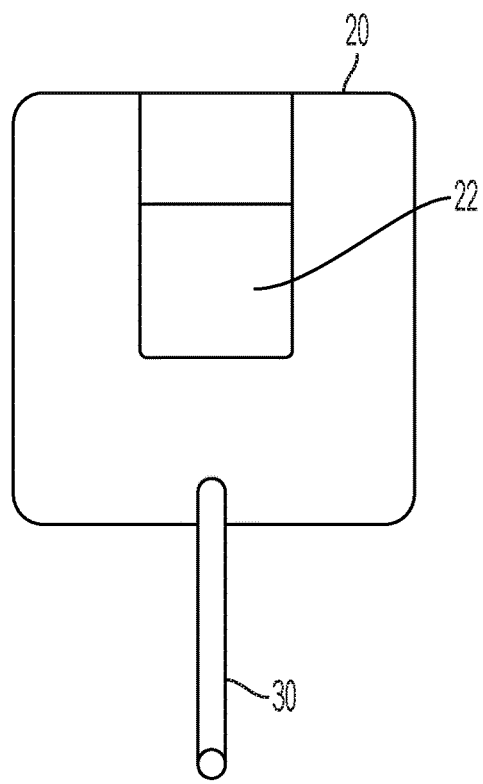
FIG. 8 is a front view of a simplified representation of an embodiment of the Smart CT.
Figure 9:
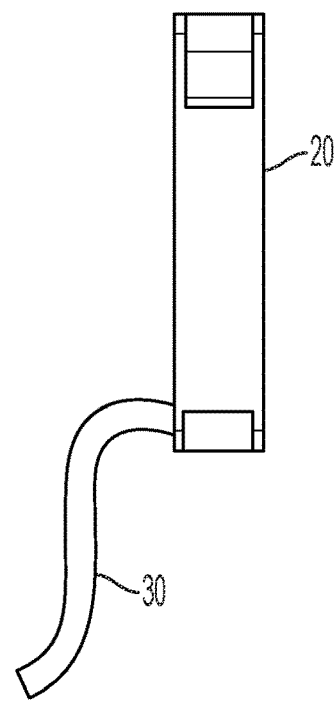
FIG. 9 is a side view of a simplified representation of an embodiment of the Smart CT.

FIG. 8 is a front view of a simplified representation of an exemplary embodiment of the Smart CT 20. FIG. 9 is a side view of the embodiment of the Smart CT shown in FIG. 8.

Figure 10:
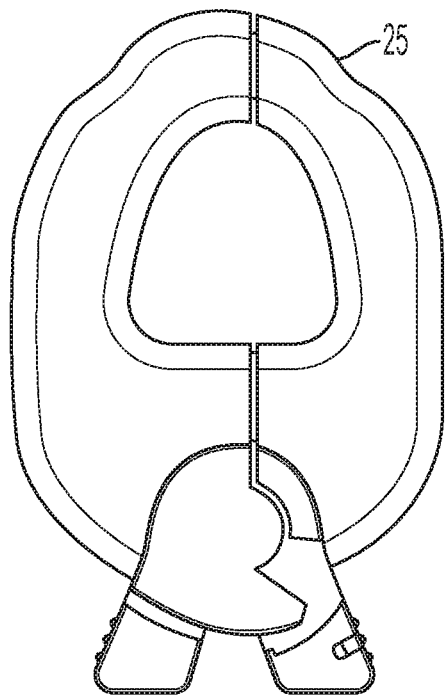
FIG. 10 is a front view of a representation of another embodiment of a Smart CT, shown in a closed position.
Figure 11:
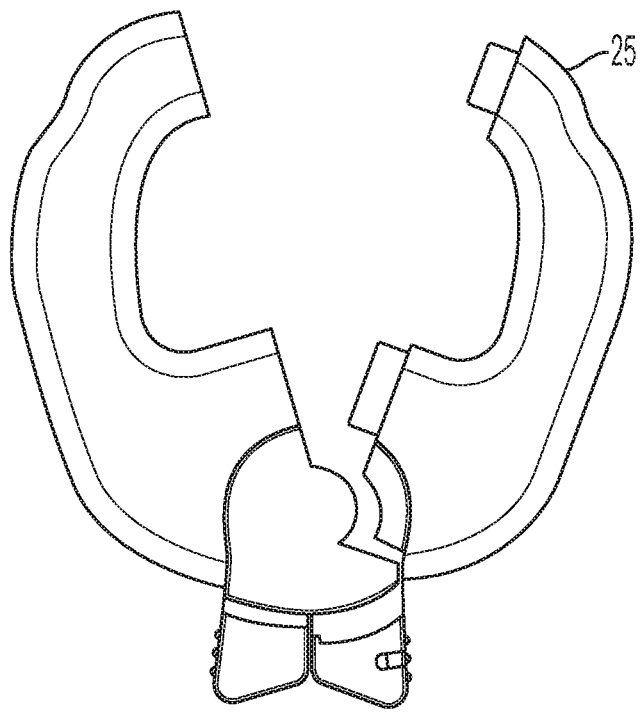
FIG. 11 is a front view of a representation of the Smart CT of FIG. 10, shown in an open position.

FIG. 10 is a front view of a representation of another exemplary embodiment of a Smart CT 25, shown in a closed position. In this case, the Smart CT is a clamp-style CT, which is sometimes may be preferred due to its relative ease of installation. FIG. 11 is a front view of the clamp-style Smart CT 25 of FIG. 10, shown in an open position.

In one embodiment, the EEPROM is a simple and compact programmable data store, that is configured to store up to 128 bytes of information. FIG. 12 is a table, illustrating the exemplary memory map for an EEPROM chip, as may be used in an embodiment of the Smart CT. The EEPROM memory map can be comprised of a header block 50 and a calibration block 52. The header block may be comprised of 16 bytes. The leading bytes of the header block can be an 8-bit CRC check (cyclic redundancy check), which is computed on the remaining 15 bytes in the block. The next byte can be the Protocol Version, which is used to designate the Header Version; in the event that the header map needs to change for some reason, the protocol version should be updated. If there are any unused bytes, they are written to 0xFF. An exemplary header block map may be configured as follows:

CRC: 1 Byte
　8 Bit CRC for data integrity checking
Header Version: 1 Byte
　Store protocol version number. Used in the event that the memory map changes
Header Version: 0x00
Serial Number: 3 Bytes
　Stores up to 16,777,215 unique serial numbers
Timestamp: 4 Bytes
　Timestamp for when the EEPROM was programmed. Stored as Unix epoch
CT Model: 1 Byte
　CT model type (i.e. universal CT, Thin CT, Hippo, etc.)
Turns Ratio: 2 Bytes
　Turns ratio for CT
Calibration Type: 1 Byte
　Type of calibration function used (i.e. single value, piecewise, polynomial, etc.)
Reserved: 3 Bytes
　Written as 0xFF The remaining 112 bytes of the EEPROM is set aside for the calibration block. The first two bytes store the 16 bit CRC which is computed on the remaining 110 bytes in the calibration block. The remaining bytes are used to store the gain and phase delay information for the particular Smart CT. Any unused bytes are written to 0xFF.

Figure 13:
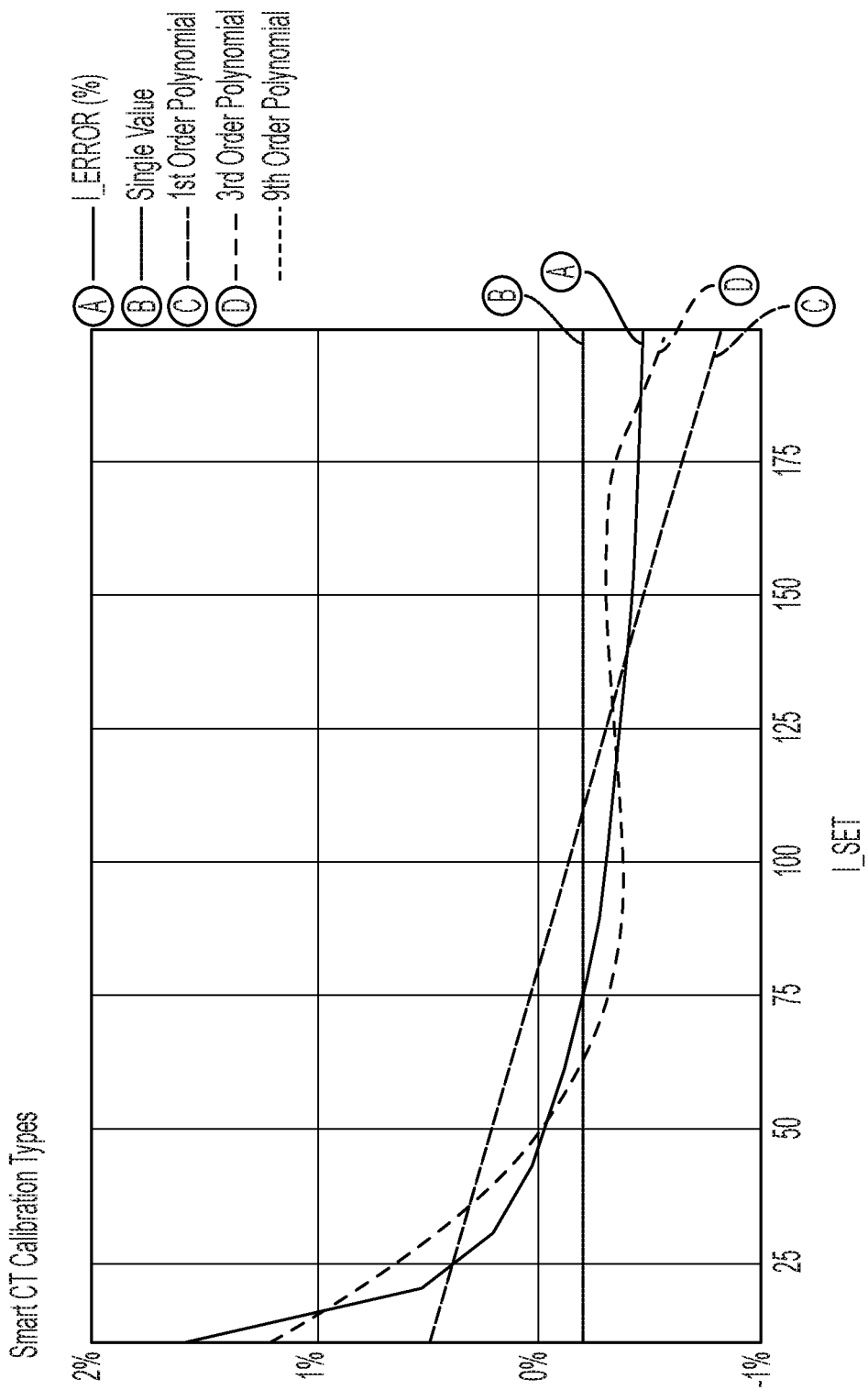
FIG. 13 is a graph illustrating various calibration types in respect of a current transformer.

The applicable gain error and phase delay for the particular Smart CT is determined by testing the Smart CT after manufacture, by subjecting the Smart CT to a range of load currents in order to calibrate the Smart CT. The calibration data across a range of load currents (with appropriate approximation to average the readings for set "blocks" of load current ranges) is then loaded onto and stored on the EEPROM. The bytes of the calibration block are mapped to specific calibration values that correspond to the Calibration Type identified in the header block. In one embodiment, an exemplary Calibration Type is configured such that the calibration values are arranged in the following manner (as also shown in FIG. 13):

Ix: 4 Bytes
　Measured current value in amps
Ix Gain Error: 4 Bytes
　Gain error in % at the measured current
Ix Phase Delay: 4 Bytes
　Phase delay in degrees at the measured current In other words, for example, over the first block of current range (say 0-50 A), a value for the approximate gain error % and for the phase delay in degrees will be given for the particular CT; this calibration data will be specified in the first 12 bytes of the calibration block. The calibration data for the next block of current range (say 51-100 A) will be given in the next 12 bytes of the calibration block, and so on. Representing the gain error and phase delay in this "stepped" fashion will provide a closer approximation to the true gain error and phase delay for the particular Smart CT.

In the above-described embodiment, the EEPROM can store up to 128 bytes of information. Although it is understood that an EEPROM with greater storage capacity could be used (which could provide for more detailed calibration data for each Smart CT), this could also bring additional complications. For example, providing for greater storage capacity will increase the power requirements for the EEPROM, such that it might need to be provided with additional power, as well as wiring to provide for such (which might not be in keeping with the one-wire protocol). Further, in the case of many residential applications, it is generally preferable to keep the design simple, such that the Smart CT is small and compact. In any event, it has been found that for many present applications, providing for 128 bytes of data in the EEPROM works well. As such, there are worthwhile considerations in keeping the storage capacity modest.

Thus, in order to use the Smart CT 20 to measure the primary current flowing through a wire (not shown), the Smart CT 20 is installed on the wire such that the wire passes through the orifice 22. The primary current ($I_p$) will be stepped down by the Smart CT 20 into a secondary current ($I_s$) according to the turns ratio or CTR of that particular Smart CT. Then, a suitable meter/instrument may be used to measure the secondary current. In the case of a suitable meter that is configured to work with a Smart CT, the meter will also be able to communicate with the Smart CT to obtain calibration data for such Smart CT from the Smart CT's EEPROM. Armed with the measured current reading of the secondary current and the calibration data for the particular Smart CT, the meter is able to calibrate the measured reading (and use the turns ratio relationship) to arrive at a more accurate determination of the primary current.

As described above, the gain error and/or phase delay for each Smart CT are stored as single values (as an approximation of the actual gain error or phase delay, over each current range "block"). However, it is contemplated that other, more complex calibration types may also be possible, such through the use of piece-wise or polynomial functions. FIG. 13 is a graph illustrating various calibration types that may be considered for use, besides a single value calibration type.

Figure 14:
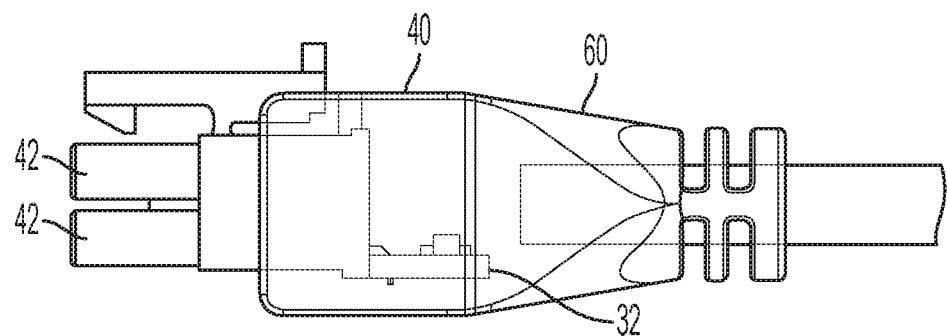
FIG. 14 is schematic side view of an embodiment of an interface for use with the Smart CT.

Referring to FIG. 14, this is schematic side view of another embodiment of an interface 40 for use with the Smart CT 20. In this embodiment, the PCB 24 and EEPROM 32, instead of being integrated into the Smart CT, are provided within the cable assembly 60 of the interface 40. As shown, the PCB and EEPROM are shown configured within the overmold of the cable assembly 60 (for ease of reference, the cable assembly 60 is shown illustrated as transparent/translucent). When the Smart CT and interface are in operation and connected together, the PCB 24 and EEPROM 32 are in wired communication with the Smart CT, in the same manner as described above. This embodiment provides some possible advantages. Firstly, from a manufacturing standpoint, it is generally somewhat easier to provide for the PCB and EEPROM within the cable assembly than within the Smart CT itself, particularly in circumstances where, in operation, it is considered desirable to keep the Smart CT relatively small. Furthermore, this embodiment can allow for the interface 40 to be used with different designs of Smart CTs (e.g. where the Smart CT is of a different shape and/or size). By way of example, if a particular shaping or size of Smart CT is required to be used, it is not necessary to re-design and remanufacture an altogether new housing for the Smart CT, so that the PCB and EEPROM may be integrated into the Smart CT. In addition, this embodiment allows for the possibility of using conventional CTs. A conventional CT used in combination with such an interface that is provided with an PCB and EEPROM, would function as a Smart CT as discussed above.

Figure 15:
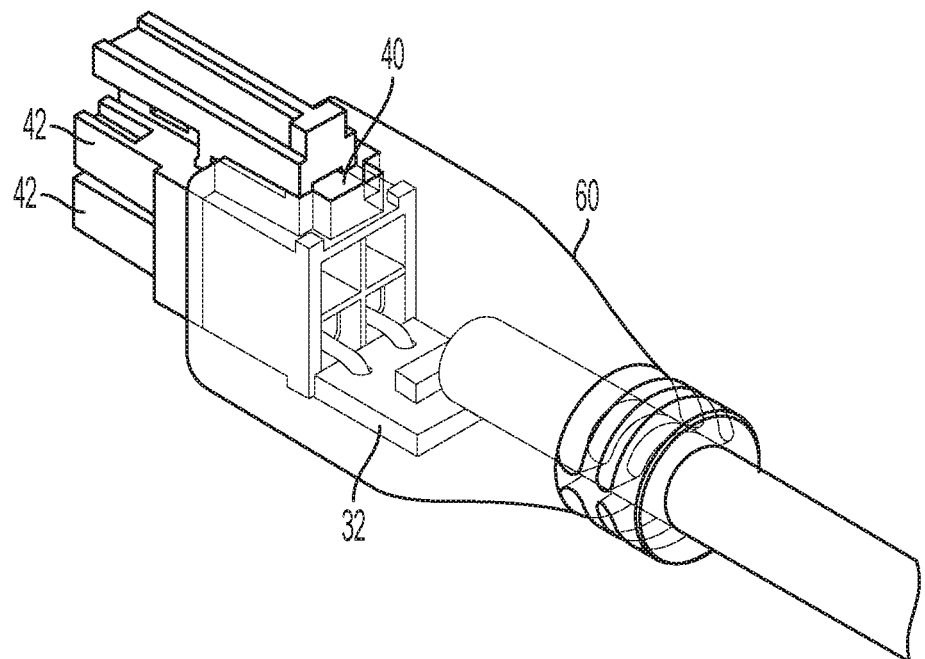
FIG. 15 is a schematic perspective view of the interface of FIG. 14.

FIG. 15 is a schematic perspective view of the interface of FIG. 14, providing an alternate view thereof.

Figure 16:
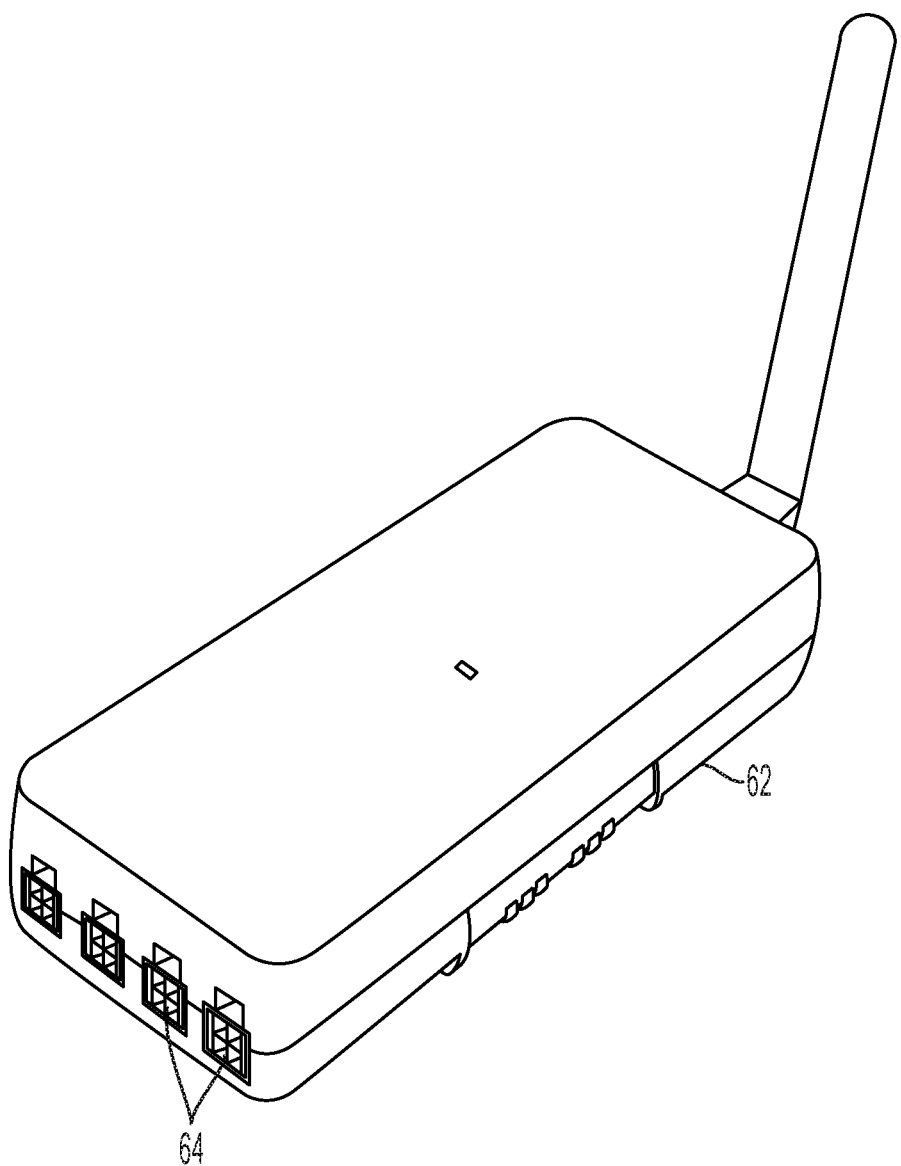
FIG. 16 is an illustration of a meter configured for use with the Smart CT and a corresponding Interface.

FIG. 16 is an illustration of an exemplary meter 62 that may be configured for use with the Smart CT 20 and a corresponding Interface 40. The meter 62 may be a simple standard current meter as previously discussed, or a meter for measuring power consumption. The meter 62 is provided with a number of corresponding ports 64 for receiving the outlets 42 from the interface 40. The meter 62 may be configured for wired communication with the Smart CT 20. Alternatively, it is contemplated that the meter 62 may also be configured for wireless communication (via communication protocols such as Wifi or Zigbee) with the Smart CT 20. Providing for wireless communication with the meter 62 may permit an additional advantage in that a Smart CT may be placed in more difficult to reach locations, since there is no need to account for wiring. Further, it is contemplated that this could allow for additional Smart CTs to be used even where a downstream meter does not have enough ports 64 for the required number of outlets 42 of the interface 40.

In another aspect, the present invention is a system (and a corresponding method) for measuring and monitoring a primary current flowing through a wire, comprising: a Smart CT as described above installed on the wire; and a meter connected to the Smart CT, and in communication with the Smart CT, to receive from the Smart CT, a secondary current and calibration data, wherein the meter measures the secondary current and calibrates such using the calibration data to determine the primary current. In other embodiments, the system may additionally comprise a computer or processor adapted to receive the measurements of the secondary current from the meter, and the calibration data from the Smart CT, in order to determine the primary current.

In another aspect, the present invention is used for measuring and monitoring the power consumption at a primary wire. The system may comprise a Smart CT as described above installed on the primary wire, and a meter 62 connected to the Smart CT and in communication therewith, to receive calibration data from the Smart CT, the Smart CT having a secondary wire, wherein the meter measures the power consumption at the secondary wire and calibrates such measurement using the calibration data to determine the power consumption at the primary wire. In an analogous manner as discussed above in which a Smart CT and meter may be used to measure the current at a primary wire ("primary current"), the system of a Smart CT and power meter may be used to measure the power consumption at the primary wire ("primary power" or Pp) The primary current ($I_p$) and the primary power ($P_p$) may be determined in relation to the gain at the meter ($G_{BODY}$), the gains error of the particular Smart CT ($G_{CT}$) and the current turns ratio of the particular Smart CT (CTR=$n_s/n_p$ or 1/turns ratio) according to the following equations:

$$I_p = I_s \cdot G_{BODY} \cdot G_{CT} \cdot CTR$$

$$P_p = P_s \cdot G_{BODY} \cdot G_{CT} \cdot CTR$$

This relationship provides a more accurate representation of the current and power consumption at the primary wire by taking into account the gains error for the specific Smart CT. Similarly, a more accurate representation of the current and power consumption at the primary wire can be determined by additionally taking into account the phase delay ($\Theta_{CT}$).

The invention claimed is:

1. A device for determining a current or power consumption at a primary wire, the device comprising:
   a current transformer, having a turns ratio and provided with a secondary wire, the current transformer adapted to be installed upon the primary wire in order to step-down a primary current at the primary wire to a secondary current at the secondary wire according to the turns ratio; and
   a non-volatile memory connected to the current transformer, wherein the non-volatile memory is configured to store calibration data across a range of load currents wherein bytes of a calibration block are mapped to specific calibration values,
   wherein the current transformer is connectable to a downstream meter for measuring a measured secondary current or a measured power consumption at the secondary wire, and wherein the current transformer is configured to communicate the calibration data to the meter, in order to calibrate the measured secondary current so as to determine the primary current or to calibrate the measured power consumption so as to determine the power consumption.

2. The device of claim 1, wherein the non-volatile memory is an EEPROM microchip.

3. The device of claim 1, wherein the current transformer is provided with an interface connected to the current transformer via the secondary wire, wherein the interface is configured to enable connection of the current transformer with the downstream meter.

4. The device of claim 3, wherein the non-volatile memory is embedded within the interface.

5. The device of claim 1, wherein the non-volatile memory is integrated with the current transformer.

6. The device of claim 1, wherein the current transformer is a clamp-style transformer actuable between an open position and a closed position, wherein in the open position, the current transformer may be installed around the primary wire, and secured upon the primary wire in the closed position.

7. The device of claim 1, wherein the calibration data includes at least one of: gain error data, phase delay data, and current transformer identification data.

8. The device of claim 7, wherein the calibration data comprises a range of values according to the primary current.

9. A system for determining current or power consumption at a primary wire, comprising:
  a current transformer, having a turns ratio and provided with a secondary wire, the current transformer adapted to be installed upon the primary wire in order to step-down a primary current at the primary wire to a secondary current at the secondary wire according to the turns ratio;
  a non-volatile memory connected to the current transformer, wherein the non-volatile memory stores calibration data across a range of load currents, wherein bytes of a calibration block are mapped to specific calibration values; and
  a downstream meter in connection with the secondary wire, for measuring at the secondary wire a measured secondary current or a measured power consumption and wherein the current transformer is configured to communicate the calibration data to the meter, in order to calibrate the measured secondary current so as to determine the primary current or to calibrate the measured power consumption so as to determine the power consumption.

10. The system of claim 9, wherein the non-volatile memory is an EEPROM microchip.

11. The system of claim 9, wherein the current transformer is provided with an interface connected to the current transformer via the secondary wire, wherein the interface is configured to enable connection of the current transformer with the downstream meter.

12. The system of claim 11, wherein the non-volatile memory is embedded within the interface.

13. The system of claim 9, wherein the current transformer is a clamp-style transformer actuable between an open position and a closed position, wherein in the open position, the current transformer may be installed around the primary wire, and secured upon the primary wire in the closed position.

14. The system of claim 9, wherein the calibration data includes at least one of:
  gain error data, phase delay data and current transformer identification data.

15. A method for determining a primary current or a power consumption at a primary wire, comprising:
  installing at the primary wire, a device comprising:
    a current transformer, having a turns ratio and provided with a secondary wire, the current transformer adapted to step-down the primary current at the primary wire to a secondary current at the secondary wire according to the turns ratio; and
    a non-volatile memory connected to the current transformer, wherein the non-volatile memory stores calibration data across a range of load currents, wherein bytes of a calibration block are mapped to specific calibration values;
  connecting a downstream meter with the current transformer via the secondary wire,
  measuring using the meter a measured secondary current or a measured power consumption at the secondary wire, and
  at the meter:
    receiving the calibration data, and
    calibrating, using the calibration data, the measured secondary current so as to determine the primary current or calibrating the measured power consumption so as to determine the power consumption.

16. The method of claim 15, wherein the non-volatile memory is an EEPROM microchip.

17. The method of claim 15, wherein the current transformer is provided with an interface connected to the current transformer via the secondary wire, wherein the interface is configured to enable connection of the current transformer with the downstream meter.

18. The method of claim 17, wherein the non-volatile memory is embedded within the interface.

19. The method of claim 15, wherein the current transformer is a clamp-style transformer actuable between an open position and a closed position, wherein in the open position, the current transformer may be installed around the primary wire, and secured upon the primary wire in the closed position.

20. The method of claim 15, wherein the calibration data includes at least one of: gain error data, phase delay data and current transformer identification data.

21. The method of claim 15, wherein prior to installing the device, the calibration data for the current transformer is determined, and stored in the non-volatile memory.

* * * * *